US009202945B2

(12) United States Patent
Colli et al.

(10) Patent No.: US 9,202,945 B2
(45) Date of Patent: Dec. 1, 2015

(54) GRAPHENE-BASED MIM DIODE AND ASSOCIATED METHODS

(75) Inventors: Alan Colli, Cambridge (GB); Shakil A. Awan, Surrey (GB); Antonio Lombardo, Cambridge (GB); Tim J. Echtermeyer, Cambridge (GB); Tero S. Kulmala, Cambridge (GB); Andrea C. Ferrari, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 599 days.

(21) Appl. No.: 13/336,589

(22) Filed: Dec. 23, 2011

(65) Prior Publication Data

US 2013/0162333 A1    Jun. 27, 2013

(51) Int. Cl.
| | |
|---|---|
| *H01L 31/0248* | (2006.01) |
| *H01L 31/0256* | (2006.01) |
| *H01L 31/0224* | (2006.01) |
| *H01L 31/108* | (2006.01) |
| *H01L 45/00* | (2006.01) |
| *H01L 31/18* | (2006.01) |

(52) U.S. Cl.
CPC .... *H01L 31/022408* (2013.01); *H01L 31/1085* (2013.01); *H01L 45/00* (2013.01); *H01L 2031/0344* (2013.01)

(58) Field of Classification Search
CPC ............ H01L 27/2418; H01L 31/0256; H01L 2031/0344; H01L 31/0224; H01L 31/022466; H01L 29/1606; H01L 31/022408; H01L 45/00; H01L 31/1085
See application file for complete search history.

(56) References Cited

U.S. PATENT DOCUMENTS

| | | | | |
|---|---|---|---|---|
| 5,828,431 | A   * | 10/1998 | Ando et al. ................. | 349/86 |
| 6,268,615 | B1 * | 7/2001 | Liu et al. .................... | 257/30 |
| 8,421,050 | B2 * | 4/2013 | Ping et al. .................... | 257/3 |
| 8,426,842 | B2 * | 4/2013 | Bowers et al. ............... | 257/9 |
| 8,471,190 | B2 * | 6/2013 | Wober et al. ................ | 250/216 |
| 8,554,022 | B1 * | 10/2013 | Hochberg et al. ............ | 385/1 |
| 8,610,989 | B2 * | 12/2013 | Avouris et al. ............... | 359/245 |
| 8,722,442 | B2 * | 5/2014 | Kim et al. .................... | 438/45 |
| 8,890,271 | B2 * | 11/2014 | Tut et al. ..................... | 257/458 |
| 8,916,825 | B1 * | 12/2014 | Egerton et al. .............. | 250/338.4 |
| 2008/0036356 | A1 * | 2/2008 | Ward et al. ................... | 313/341 |
| 2008/0149900 | A1 * | 6/2008 | Jang et al. ................... | 252/511 |
| 2009/0110627 | A1 * | 4/2009 | Choi et al. .................. | 423/447.1 |
| 2009/0181502 | A1 * | 7/2009 | Parikh et al. ................ | 438/164 |
| 2009/0257265 | A1 * | 10/2009 | Chen et al. ................... | 365/148 |
| 2009/0257270 | A1 * | 10/2009 | Schricker et al. ............ | 365/148 |
| 2009/0278556 | A1 * | 11/2009 | Man et al. .................... | 324/693 |
| 2010/0002324 | A1 * | 1/2010 | Rozhin et al. ................ | 359/896 |

(Continued)

OTHER PUBLICATIONS

Zhu et al., Optical Rectenna Solar Cells Using Graphene Geometric Diodes, University of Colorado, USA, Photovoltaic Specialists Conference, Jun. 2011, 37th IEEE.*

(Continued)

*Primary Examiner* — William F Kraig
*Assistant Examiner* — Maliheh Malek
(74) *Attorney, Agent, or Firm* — Harrington & Smith

(57) ABSTRACT

An apparatus including first and second layers of electrically conductive material separated by a layer of electrically insulating material, wherein one or both layers of electrically conductive material include graphene, and wherein the apparatus is configured such that electrons are able to tunnel from the first layer of electrically conductive material through the layer of electrically insulating material to the second layer of electrically conductive material.

8 Claims, 9 Drawing Sheets

(56) References Cited

U.S. PATENT DOCUMENTS

| | | | |
|---|---|---|---|
| 2010/0003528 A1* | 1/2010 | Rozhin et al. | 428/429 |
| 2010/0025662 A1* | 2/2010 | Cho et al. | 257/40 |
| 2010/0078067 A1* | 4/2010 | Jia et al. | 136/256 |
| 2010/0081268 A1* | 4/2010 | Schricker et al. | 438/600 |
| 2010/0108982 A1* | 5/2010 | Ping et al. | 257/5 |
| 2010/0127243 A1 | 5/2010 | Banerjee et al. | 257/39 |
| 2010/0127312 A1* | 5/2010 | Grebel et al. | 257/288 |
| 2010/0200839 A1* | 8/2010 | Okai et al. | 257/29 |
| 2010/0273060 A1* | 10/2010 | Yang et al. | 429/231.8 |
| 2010/0315857 A1* | 12/2010 | Sonehara et al. | 365/148 |
| 2010/0327956 A1* | 12/2010 | Karkkainen et al. | 327/530 |
| 2011/0006837 A1* | 1/2011 | Wang et al. | 327/539 |
| 2011/0014457 A1* | 1/2011 | Quitoriano et al. | 428/336 |
| 2011/0018424 A1* | 1/2011 | Takada | 313/352 |
| 2011/0042650 A1* | 2/2011 | Avouris et al. | 257/29 |
| 2011/0045282 A1 | 2/2011 | Kelber | |
| 2011/0068290 A1* | 3/2011 | Haddon et al. | 252/62.51 R |
| 2011/0140064 A1 | 6/2011 | Bandyopadhyay et al. | 257/2 |
| 2011/0163280 A1* | 7/2011 | Rozhin et al. | 252/582 |
| 2011/0163298 A1 | 7/2011 | Sung | 357/29 |
| 2011/0240946 A1 | 10/2011 | Miao et al. | 257/3 |
| 2011/0269629 A1* | 11/2011 | Giustino et al. | 505/100 |
| 2011/0300338 A1* | 12/2011 | Shin et al. | 428/156 |
| 2012/0015166 A1* | 1/2012 | Kelber | 428/215 |
| 2012/0031477 A1* | 2/2012 | Fogel et al. | 136/255 |
| 2012/0049239 A1* | 3/2012 | Sung | 257/103 |
| 2012/0068152 A1* | 3/2012 | Hwang et al. | 257/9 |
| 2012/0070973 A1* | 3/2012 | Sandhu et al. | 438/584 |
| 2012/0085991 A1* | 4/2012 | Cohen et al. | 257/28 |
| 2012/0141799 A1* | 6/2012 | Kub et al. | 428/408 |
| 2012/0168724 A1* | 7/2012 | Park et al. | 257/29 |
| 2012/0199807 A1* | 8/2012 | Goswami | 257/9 |
| 2012/0205606 A1* | 8/2012 | Lee et al. | 257/2 |
| 2012/0211723 A1* | 8/2012 | Dimitrakopoulos et al. | 257/9 |
| 2012/0223291 A1* | 9/2012 | Klem et al. | 257/21 |
| 2012/0228614 A1* | 9/2012 | Kitamura et al. | 257/52 |
| 2012/0241069 A1* | 9/2012 | Hofmann et al. | 156/60 |
| 2012/0258587 A1* | 10/2012 | Kub et al. | 438/610 |
| 2012/0282419 A1* | 11/2012 | Ahn et al. | 428/34.8 |
| 2012/0292596 A1* | 11/2012 | Dabrowski et al. | 257/29 |
| 2013/0048951 A1* | 2/2013 | Heo et al. | 257/29 |
| 2013/0048952 A1* | 2/2013 | Chen et al. | 257/29 |
| 2013/0081693 A1* | 4/2013 | Kaufman | 136/257 |
| 2013/0082241 A1* | 4/2013 | Kub et al. | 257/21 |
| 2013/0092238 A1* | 4/2013 | Ogata et al. | 136/263 |
| 2013/0107344 A1* | 5/2013 | Avouris et al. | 359/245 |
| 2013/0149554 A1* | 6/2013 | Haque et al. | 428/688 |
| 2013/0164882 A1* | 6/2013 | Afzali-Ardakani et al. | 438/87 |
| 2013/0221322 A1* | 8/2013 | Ohlsson | 257/13 |
| 2013/0294729 A1* | 11/2013 | Layton et al. | 385/40 |
| 2014/0023321 A1* | 1/2014 | Lu et al. | 385/40 |
| 2014/0044968 A1* | 2/2014 | Papakonstantinou et al. | 428/402 |
| 2014/0054550 A1* | 2/2014 | Hong et al. | 257/29 |
| 2014/0077161 A1* | 3/2014 | Duan et al. | 257/29 |
| 2014/0077162 A1* | 3/2014 | Bowers et al. | 257/29 |
| 2014/0120270 A1* | 5/2014 | Tour et al. | 427/596 |
| 2014/0145735 A1* | 5/2014 | Koester | 324/686 |
| 2014/0183736 A1* | 7/2014 | Cox et al. | 257/741 |
| 2014/0193626 A1* | 7/2014 | Ozyilmaz et al. | 428/220 |
| 2014/0206192 A1* | 7/2014 | Yeom et al. | 438/694 |
| 2014/0335650 A1* | 11/2014 | Avouris et al. | 438/98 |
| 2015/0038378 A1* | 2/2015 | Cheng et al. | 506/39 |
| 2015/0083206 A1* | 3/2015 | Novoselov et al. | 136/256 |

OTHER PUBLICATIONS

"Graphene Photonics and Optoelectronics," F. Bonaccorso, Z. Sun, T. Hasan and A. C. Ferrari, University of Cambridge, Nature Photonics, pp. 611-622, Aug. 31, 2010.*

"Plasmonically Enhanced Hot Electron Based Photovoltaic Device," Faith B. Atar, Enes Battal, Levent E. Aygun, Bihter Daglar, Mehmet Bayindir, and Ali K Okyay, Ankara-Turkey, Mar. 14, 2013.*

Banerjee, S., et al., Novel Transistor Concepts Based on 2D Systems-Graphene and Topological Insulators, Oral Presentation at the NSF AFOSR Workshop: 2D Materials and Devices Beyond Graphene, Arlington VA USA, May 30-31, 2012, (47 pages).

Nair, R. R. et al. "Fine structure constant defines transparency of graphene", Science320, 1308-1308 (2008).

Dawlaty, J. M. et al. "Measurement of the optical absorption spectra of epitaxial graphene from terahertz to visible", Appl. Phys. Lett. 93, (pp. 131905-1 through 131905-3), (2008).

F. Bonaccorso, et al, "Graphene Photonics and Optoelectronics", Nat. Photonics 4, (pp. 611-622). (2010).

C. Casiraghi. et. al., "Rayleigh Imaging of Graphene and Graphene Layers",Nano Lett. 7, (pp. 2711-2717), (2007).

Xia, F., Mueller, T., Lin, Y.-M., Valdes-Garcia, A. and Avouris, P. "Ultrafast graphene photodetector", Nature Nanotech. 4, (pp. 839-843), (2009).

A. Urich, K. Unterrainer, T. Mueller, "Intrinsic Response Timer of Graphene Photodetectors", Nano Lett. 11, (pp. 2804-2808), (2011).

X. Du, I. Skachko, A. Barker and E. Andrei. "Approaching ballistic transport in suspended grapheme". Nat. Nanotechnol. 3, (pp. 491-495), (2008).

Vasko, F. T. and Ryzhii, V. "Photoconductivity of intrinsic graphene", Phys. Rev. B77, (pp. 195433-1 through 195433-8), (2008).

Park, J., Aim, Y. H. and Ruiz-Vargas, C. "Imaging of photocurrent generation and collection in single-layer graphene", Nano Lett. 9, (pp. 1742-1746), (2009).

Xia, F. N. et al. "Photocurrent imaging and efficient photon detection in a graphene transistor", Nano Lett.9, (pp. 1039-1044), (2009).

T. Mueller, F. Xia, M. Freitag, J. Tsang, and Ph. Avouris, "Role of contacts in graphene transistors: A scanning photocurrent study", Phys. Rev. B 79, (pp. 245430-1 through 24530-6), (2009).

Mueller, T., Xia, F. and Avouris, P. "Graphene photodetectors for high-speed optical communications", Nature Photon. 4, (pp. 297-301), (2010).

T.J. Echtermeyer et. al., "Strong Plasmonic Enhancement of Photovoltage in Graphene", Nat. Commun. x:x doi: 10.1038/ncomms1464 (5 pages), (2011).

Z. Sun et. al., "Graphene Mode-Locked Ultrafast Laser", ACS Nano 4, (pp. 803-810), (2010).

P. A. George, et al, "Ultrafast Optical-PumpTerahertz-Probe Spectroscopy of the Carrier Relaxation and Recombination Dynamics in Epitaxial Graphene" Nano Lett. 8,(pp. 4248-4251), (2008).

L. Huang, et al, "Ultrafast Transient Absorption Microscopy Studies of Carrier Dynamics in Epitaxial Graphene", Nano Lett. 10, 1308 (2010).

C. Dean et. al, "Boron Nitride Substrates for High-quality Graphene Electronics" Nature Nanotechnol. 5, (pp. 722-726), (2010) (BN substrates).

Grossman, et al., "Controlled Barrier Modification in Nb/NbOxs/Ag Metal Insulator Metal Tunnel Diodes" J. Appl. Phys. 91, (pp. 10134-10139), (2002).

Bean, et al., "Thermal Infared Detection Using Dipole Antenna-Coupled Metal-Oxide-Metal Diodes", J. Vac. Sci. Technol. B 27, (pp. 11-14), (2009).

Krishnan, et al., "Effects of Dielectric Thickness and Contact Area on Current-Voltage Characteristics of Thin Film Metal-Insulator-Metal Diodes" Thin Solid Films 516, (pp. 2244-2250), (2008).

Cowell, et al., "Advancing MIM Electronics: Amorphous Metal Electrodes", Adv. mater. 23, (pp. 74-78), (2011).

P. Sharma, et al, "Nano-Fabrication With Metallic Glass-an Exotic Material for Nano Electromechanical Systems", Nanotechnology 18, (pp. 1-6), 035302 (2007).

Burshtein, et al., "Photo-Induced Tunnel Currents in Al-Al2O3-Au Structures", Phys. Rev. B 12, (pp. 3453-3457) (1975).

Marshalek, et al, "Photoresponse Characteristics of Thin-Film Nickel-Nickel Oxide-Nickel Tunneling Junctions", IEEE J. Quantum Electron. QE-19, (pp. 743-754), (1983).

Berglund, et al., "Photoemission Studies of Copper and Silver: Experiment", Phys. Rev. 136, (pp. A 1044-A 1064), (1964).

(56) References Cited

OTHER PUBLICATIONS

Seyoung Kim, et al, "Realization of a high mobility dual-gated graphene field-effect transistor with Al2O3 dielectric", Appl. Phys. Lett. 94, (pp. 062107-062107-3) (2009).

L. Ponomarenko et al., "Tunable Metal-Insulator Transition in Double-Layer Graphene Heterostructures", arxiv1107.0115 (BN sandwitch), (4 pages), (Oct. 2009).

K. S. Novoselov, et al, "Electric Field Effect in Atomically Thin Carbon Films" Science 306, (pp. 666-669), (2004).

Claire Berger, et al, "Electronic Confinement and Coherence in Patterned Epitaxial Graphene", (7 pages), (2006).

Sukang Bae, et al, "Roll-to-roll production of 30-inch graphene films for transparent electrodes", Nature Nanotechnology 5, (pp. 574-578), (2010).

T.J. Echtermeyer et. al., "Nonvolatile Switching in Graphene Filed-Effect Devices", IEEE EDL 29, (pp. 952-954) (2008).

Young-Jun Yu, et al, "Tuning the Graphene Work Function by Electric Field Effect", Nano Lett. 9, (pp. 3430-3434), (2009).

\* cited by examiner

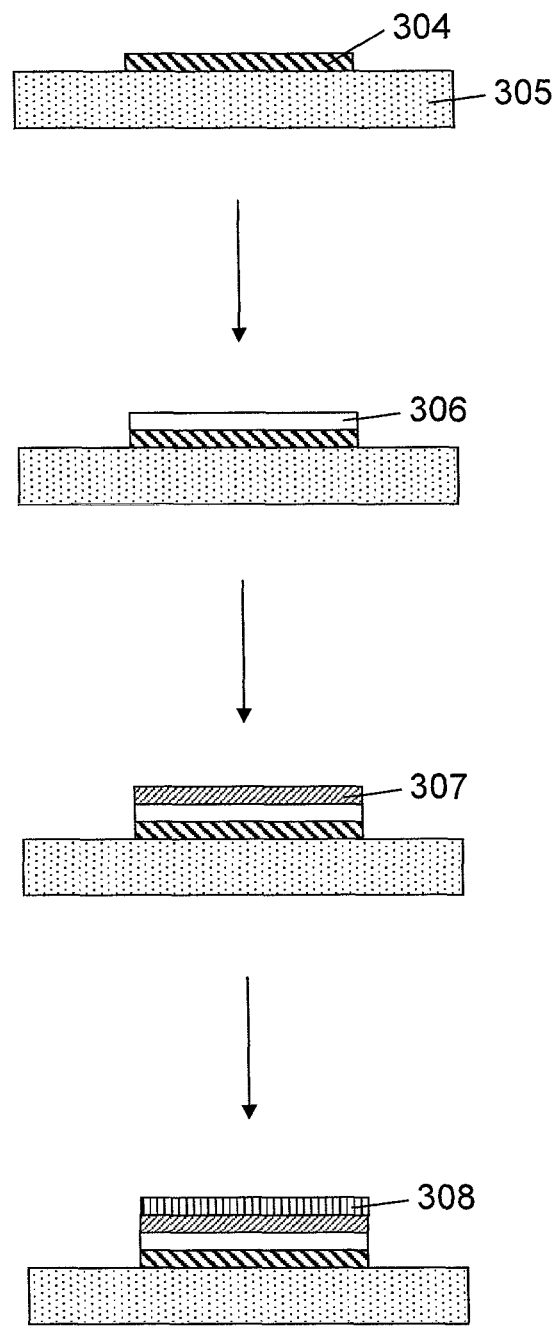

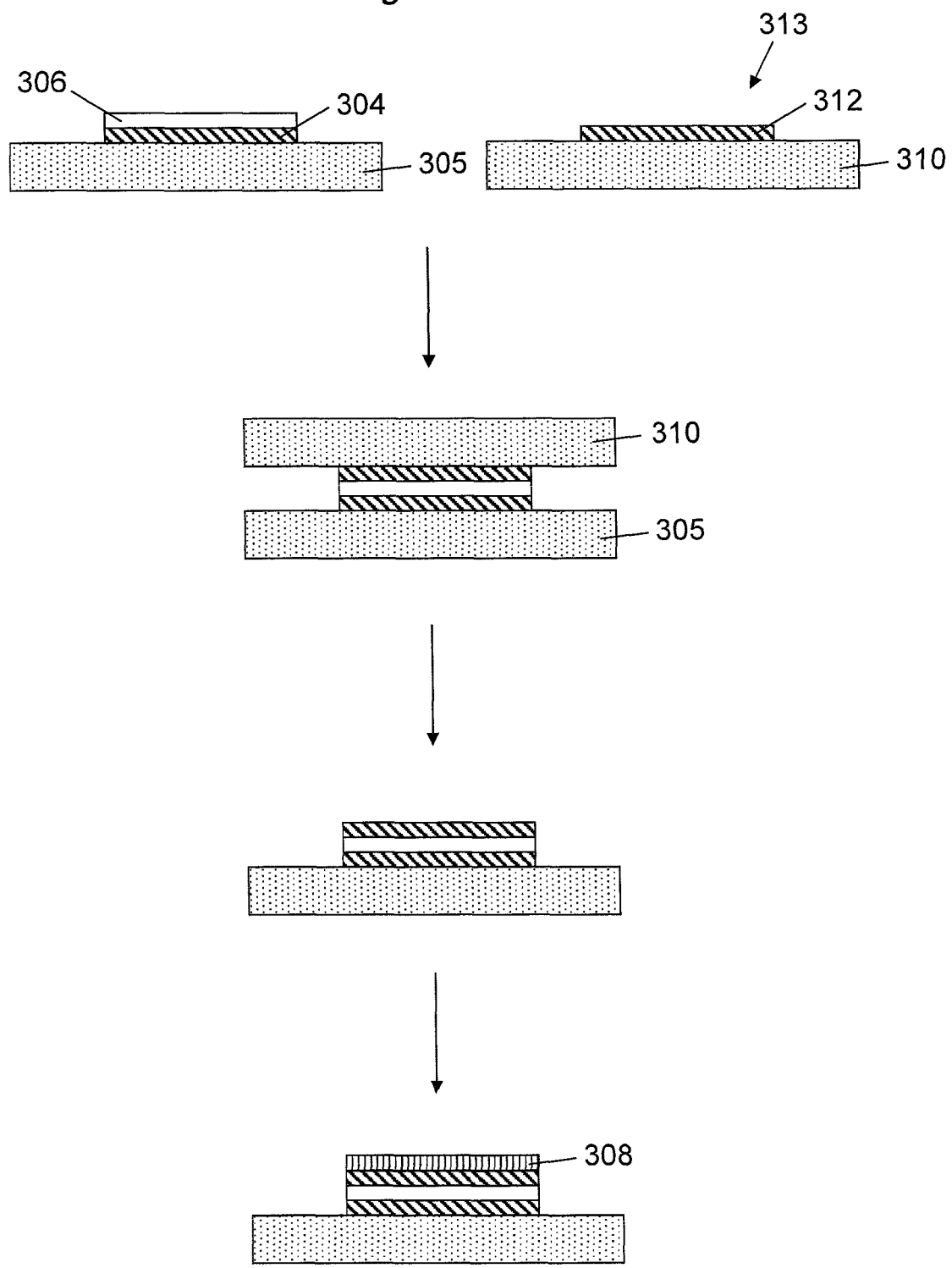

GRAPHENE-BASED MIM DIODE AND ASSOCIATED METHODS

TECHNICAL FIELD

The present disclosure relates to the field of metal-insulator-metal (MIM) diodes, associated methods and apparatus, and in particular concerns a graphene-based MIM diode which may be used in photodetectors and rectennas. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

MIM diodes have previously been fabricated using thermal or plasma oxidation of crystalline metal films. Diodes fabricated in this way, however, exhibit poor yield and performance. To a large extent, these problems can be attributed to the roughness of the metal surface, which is often greater than the thickness of the insulator. The roughness of the metal results in a non-uniform electric field across the device, which makes it difficult to control the electron tunnelling.

Recently, the use of an amorphous metal layer has been proposed for reducing surface roughness in MIM devices. The proposed material, however, is an alloy (ZrCuAlNi) consisting of four metals, which increases the complexity and cost of fabrication.

Furthermore, such alloys are not suitable for use in flexible and transparent electronics because the material is opaque and relatively brittle.

The apparatus and methods disclosed herein may or may not address this issue.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising first and second layers of electrically conductive material separated by a layer of electrically insulating material, wherein one or both layers of electrically conductive material comprise graphene, and wherein the apparatus is configured such that electrons are able to tunnel from the first layer of electrically conductive material through the layer of electrically insulating material to the second layer of electrically conductive material.

The apparatus may be configured such that electrons are unable to tunnel from the second layer of electrically conductive material through the layer of electrically insulating material to the first layer of electrically conductive material by virtue of providing a difference in voltage to the first and second layers of electrically conductive material, and/or providing a difference in work function between the first and second layers of electrically conductive material.

The first and second layers of electrically conductive material may be made solely from graphene. The first layer of electrically conductive material may comprise graphene, and the second layer of electrically conductive material may comprise one or more of Cr, Au, Al, Ni, Cu, Pt, W, and indium tin oxide or an alloy comprising one or more of the same. The second layer of electrically conductive material may comprise one or more nanopillars.

The layer of electrically insulating material may comprise one of $Al_2O_3$, $HfO_2$, BN and diamond-like carbon. The layer of electrically insulating material may have a thickness of no greater than 15 nm, possibly 5-10 nm, which can be extended to 5-15 nm just in case strong biases are to be used. The thickness of the oxide can be considered to be critical for proper tunnelling. It can not be too thick, but it can not be too thin either or a different type of full-barrier tunnelling (bias-independent) will take place.

One or more of the first layer of electrically conductive material, the second layer of electrically conductive material and the layer of electrically insulating material may be optically transparent. The expression "optically transparent" may be taken to mean transparent to one or more different types of electromagnetic radiation (e.g. UV, IR, visible light, microwave, radio, or X-rays), rather than just transparent solely to visible light.

The apparatus may be formed on a supporting substrate. The supporting substrate may be electrically insulating. The supporting substrate may be optically transparent. The supporting substrate may comprise glass or oxidised silicon.

The apparatus may comprise a passivation layer on top of the uppermost layer of electrically conductive material (i.e. the first or second layer of electrically conductive material depending on the fabrication process used to form the apparatus).

The apparatus may comprise a voltage source. The voltage source may be configured to apply a potential difference between the layers of electrically conductive material to facilitate the tunnelling of electrons from the first layer of electrically conductive material through the layer of electrically insulating material to the second layer of electrically conductive material, and impede the tunnelling of electrons from the second layer of electrically conductive material through the layer of electrically insulating material to the first layer of electrically conductive material. The voltage source may be configured to apply a negative potential to the first layer of electrically conductive material and/or a positive potential to the second layer of electrically conductive material.

The electrons may be hot electrons generated when the first layer of electrically conductive material is illuminated by electromagnetic radiation (e.g. UV, IR, visible light, microwave, radio, or X-rays). The apparatus may comprise a source of electromagnetic radiation configured to illuminate the first layer of electrically conductive material with electromagnetic radiation in order to generate the hot electrons.

The apparatus may comprise an antenna. The antenna may be configured to allow a flow of electrons when the antenna is illuminated by electromagnetic radiation (e.g. UV, IR, visible light, microwave, radio, or X-rays). The apparatus may be configured such that the electrons are able to tunnel from the first layer of electrically conductive material through the layer of electrically insulating material to the second layer of electrically conductive material. The apparatus may be configured such that the electrons are unable to tunnel from the second layer of electrically conductive material through the layer of electrically insulating material to the first layer of electrically conductive material. The apparatus may comprise a source of electromagnetic radiation configured to illuminate the antenna with electromagnetic radiation in order to generate the flow of electrons.

The apparatus may comprise an ammeter configured to measure an electrical current formed by the tunnelling electrons.

The apparatus may be a diode. The apparatus may form part of a photodetector or a rectenna.

According to a further aspect, there is provided a device comprising any apparatus described herein. The device may be one of the following: an electronic device, a portable electronic device, a portable telecommunications device, and a module for any of the aforementioned devices. The apparatus may be considered to be the device or a module for the device.

According to a further aspect, there is provided an apparatus comprising first and second means for electrical conduction separated by a means for electrical insulation, wherein one or both of the means for electrical conduction comprise graphene, and wherein the apparatus is configured such that electrons are able to tunnel from the first means for electrical conduction through the means for electrical insulation to the second means for electrical conduction.

According to a further aspect, there is provided a method comprising: forming an apparatus from a first layer of electrically conductive material, a second layer of electrically conductive material and a layer of electrically insulating material to provide an apparatus comprising the first and second layers of electrically conductive material separated by the layer of electrically insulating material, wherein one or both layers of electrically conductive material comprise graphene, and wherein the apparatus is configured such that electrons are able to tunnel from the first layer of electrically conductive material through the layer of electrically insulating material to the second layer of electrically conductive material.

Formation of the apparatus may comprise: depositing the first layer of electrically conductive material on top of a supporting substrate; depositing the layer of electrically insulating material on top of the first layer of electrically conductive material; and depositing the second layer of electrically conductive material on top of the layer of electrically insulating material.

Formation of the apparatus may comprise: depositing the first layer of electrically conductive material on top of a first supporting substrate; depositing the layer of electrically insulating material on top of the first layer of electrically conductive material; depositing the second layer of electrically conductive material on top of a second supporting substrate; placing the first supporting substrate on top of the second supporting substrate such that the first layer of electrically conductive material is separated from the second layer of electrically conductive material by the layer of electrically insulating material; and removing the first supporting substrate.

Formation of the apparatus may comprise: depositing the first layer of electrically conductive material on top of a first supporting substrate; depositing the layer of electrically insulating material on top of the first layer of electrically conductive material; depositing the second layer of electrically conductive material on top of a second supporting substrate; placing the second supporting substrate on top of the first supporting substrate such that the first layer of electrically conductive material is separated from the second layer of electrically conductive material by the layer of electrically insulating material; and removing the second supporting substrate.

According to a further aspect, there is provided a method comprising: controlling a flow of electrical current to be in a first direction in an apparatus, the apparatus comprising first and second layers of electrically conductive material separated by a layer of electrically insulating material, wherein one or both layers of electrically conductive material comprise graphene, and wherein the apparatus is configured such that electrons are able to tunnel from the first layer of electrically conductive material through the layer of electrically insulating material to the second layer of electrically conductive material, the flow of electrical current controlled by providing a difference in voltage to the first and second layers of electrically conductive material, and/or providing a difference in work function between the first and second layers of electrically conductive material.

The steps of any method disclosed herein do not have to be performed in the exact order disclosed, unless explicitly stated or understood by the skilled person.

According to a further aspect, there is provided a computer program, recorded on a carrier, the computer program comprising computer code configured to perform, when run on a processor, any method described herein.

The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described example embodiments.

The above summary is intended to be merely exemplary and non-limiting.

BRIEF DESCRIPTION OF THE FIGURES

A description is now given, by way of example only, with reference to the accompanying drawings, in which:

FIG. 1b shows an energy band diagram for the MIM diode of FIG. 1a;

FIG. 2b shows an energy band diagram for the MIM diode of FIG. 2a;

FIG. 3a shows a first method of fabricating the present apparatus;

FIG. 3c shows a third method of fabricating the present apparatus;

DESCRIPTION OF SPECIFIC ASPECTS/EMBODIMENTS

Figure 1A:
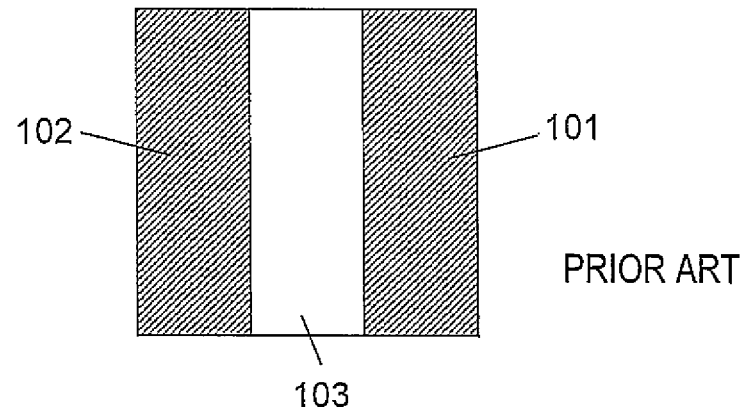
FIG. 1a shows a conventional MIM diode without an applied potential.

Diodes are circuit elements that allow a flow of electricity in one direction but not in the opposite direction. They are used in most electronic devices, but as will be described in detail later, serve a key purpose in rectennas and photodetectors. The majority of diodes are currently made from silicon, which is relatively inexpensive and easy to use in manufacturing. However, silicon-based diodes have been found to limit the performance of modern devices in terms of operational speed and power consumption.

Metal-insulator-metal (MIM) diodes may provide a solution to this problem. Unlike silicon-based diodes in which current flow involves the movement of electrons and holes across a p-n or Schottky junction, electron tunnelling is the predominant transport mechanism in MIM diodes. A MIM diode comprises two thin metal electrodes 101, 102 (typically with different work functions) separated by an ultrathin (≤15 nm) layer of insulating material 103. When electrons in one metal 101 have sufficient energy (e.g. by applying a potential difference across the metal layers 101, 102 or illuminating one of the metals 101 with electromagnetic radiation), they are able cross the insulating barrier 103 to the other metal 102 via a quantum mechanical tunnelling mechanism resulting in a flow of current. Since electrons can tunnel through the insulator 103 far quicker than electrons and holes can travel through a semiconductor, MIM diodes have the potential to operate much faster than silicon-based diodes.

Figure 1B:
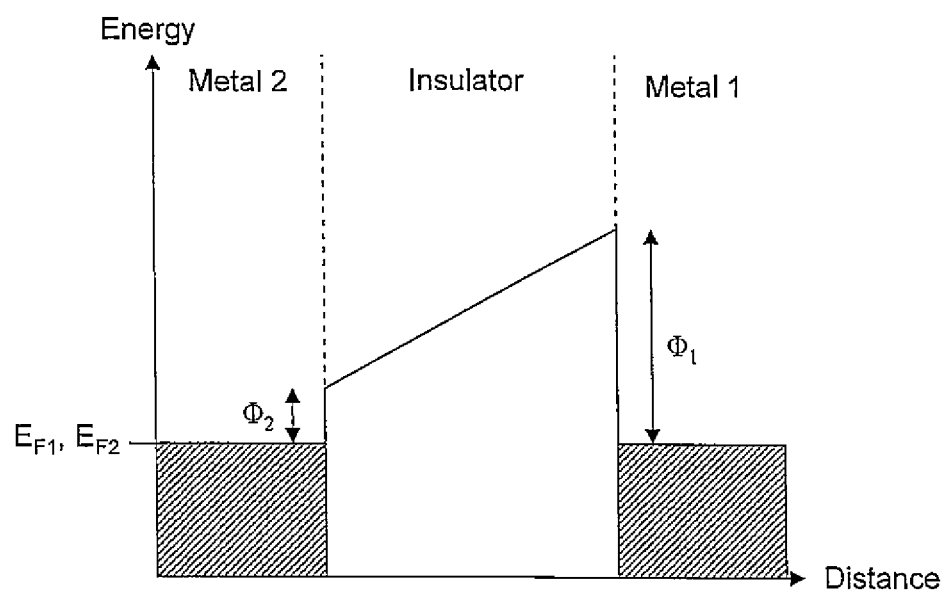

FIG. 1a shows a MIM diode without an applied voltage, and FIG. 1b shows an associated energy band diagram. The shape of the energy band diagram is determined by the following quantities: the work function of metal 1 ($\Phi_1$), the work function of metal 2 ($\Phi_2$), the electron affinity of the insulator, the bandgap of the insulator, and the valence and conduction band offsets. In this example, the Fermi level of metal 1 ($E_{F1}$) is the same as the Fermi level of metal 2 ($E_{F2}$). Without an applied voltage, the electrons in metal 1 (or metal 2) must tunnel through the entire thickness of insulator in order to reach metal 2 (or metal 1). As a result, the tunnelling probability is small.

Figure 2A:
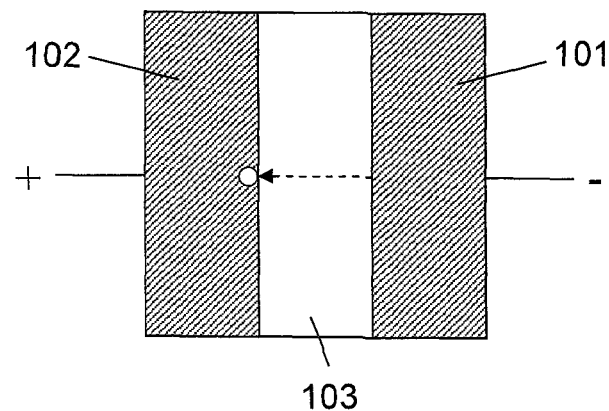
FIG. 2a shows a conventional MIM diode with an applied potential.
Figure 2B:
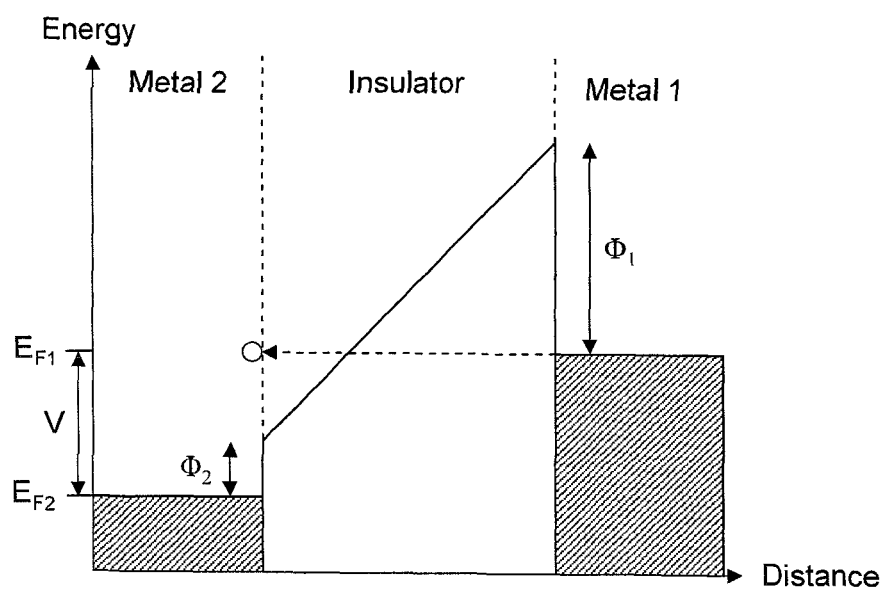

When a potential difference (V) is applied (FIG. 2a), however, the energy band diagram changes (FIG. 2b). In this example, a negative potential is applied to metal 1 and a positive potential is applied to metal 2. This causes the Fermi level of metal 1 to increase and the Fermi level of metal 2 to decrease such that $E_{F1}-E_{F2}=V$. Since $E_{F1}$ is now greater than the barrier height at metal 2, the thickness of the insulator at the Fermi level of metal 1 is reduced. This increases the probability of electrons tunnelling from metal 1 to metal 2 and therefore the tunnelling current. A corresponding situation occurs if a positive potential is applied to metal 1 and a negative potential is applied to metal 2, except that the electrons tunnel from metal 2 to metal 1.

The tunnelling probability is therefore a function of the applied potential. If the potential difference is increased, the insulator thickness at the Fermi level decreases and the tunnelling current increases. Applying a potential difference also has the effect of impeding the flow of electrons in the opposite direction (i.e. from metal 2 to metal 1 in FIG. 2b), which is important if the device is to function effectively as a circuit diode.

As mentioned in the background section, the surface roughness of crystalline metal films has so far resulted in MIM diodes which exhibit unreliable tunnelling behaviour. Whilst the use of amorphous metal films has been shown to improve the behaviour of MIM diodes, these films increase the cost and complexity of fabrication, and are unsuitable for use in flexible and transparent electronics. There will now be described an apparatus and associated methods that may or may not provide a solution to this problem.

The present apparatus comprises a MIM diode in which one or both of the metal layers are replaced by (or at least comprise) graphene. The layers may be formed solely from graphene, or may comprise graphene and one or more other materials. In the latter scenario, the graphene may be doped with the one or more other materials; some regions of the layer may be formed from the graphene whilst other regions of the layer are formed from the one or more other materials; or the layer may comprise a plurality of sub-layers wherein graphene forms at least one sub-layer and the one or more other materials form at least one other sub-layer.

Since graphene is ultra-smooth, it is possible to deposit an insulating layer on top of the graphene which has a low surface roughness. In addition, graphene is a far simpler and cheaper alternative to the complex amorphous metal alloys suggested in the literature, and also allows the realization of flexible and transparent MIM diodes.

The apparatus may be fabricated via a number of different routes depending on whether graphene plays the role of the top electrode, the bottom electrode, or both electrodes.

FIG. 3a shows a process for making a graphene-based MIM diode in which graphene forms the bottom electrode. First, a layer of graphene 304 (produced by micromechanical exfoliation, by thermal annealing of SiC, or by CVD growth) is deposited (e.g. transferred mechanically from another substrate) onto an insulating substrate 305 (e.g. glass or an oxidized silicon wafer), before a thin insulating layer 306 (2-15 nm thick) is deposited on top of the graphene 304. The insulator 306 may be, for example, $Al_2O_3$, $HfO_2$, BN or diamond-like carbon, and can either be grown directly on top of the graphene 304 using atomic layer deposition (ALD), or transferred mechanically from another substrate. A top electrode 307 (comprising one or more of Cr, Au, Al, Ni, Cu, Pt, W, and indium tin oxide or an alloy comprising one or more of the same) is then deposited (e.g. by thermal evaporation, sputter coating or CVD) onto the insulator 306.

A passivation layer 308, such as a layer of oxide, may be deposited (e.g. by CVD) on the top electrode 307 to prevent detrimental reactions with the environment (although this is not absolutely necessary).

Figure 3B:
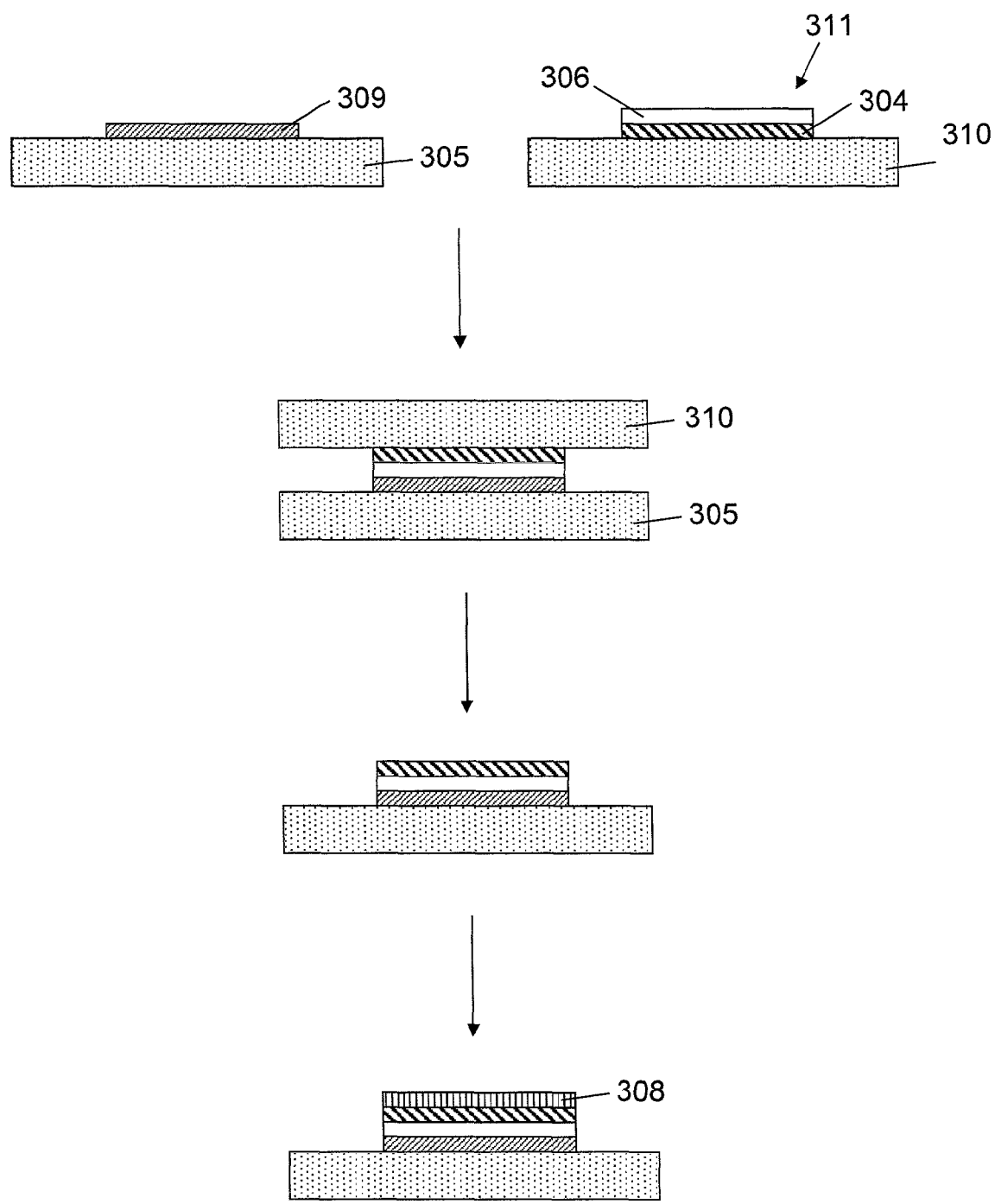
FIG. 3b shows a second method of fabricating the present apparatus.

FIG. 3b shows a process for making a graphene-based MIM diode in which graphene forms the top electrode. To begin, a bottom electrode 309 is deposited (e.g. by thermal evaporation, sputter coating or CVD) onto an insulating substrate 305 (e.g. a glass or oxidized silicon wafer). It is important that the material used to form the bottom electrode 309 is not prone to oxidation in air, otherwise the reliability of the junction may be compromised. To satisfy this requirement, the bottom electrode 309 may comprise, for example, one or more of Au, Ni, Pt, and W or an allow comprising one or more of the same. A layer of graphene 304 is then deposited (e.g. transferred mechanically from another substrate) onto a sacrificial substrate 310 followed by a layer of insulator 306 (e.g. $Al_2O_3$, $HfO_2$, BN or diamond-like carbon) on top of the graphene 304 (e.g. by ALD or by transferred mechanically from another substrate). To form the MIM diode, the graphene/insulator/substrate structure 311 is then transferred face-down onto the bottom electrode 309 and the sacrificial substrate 310 is removed (e.g. by etching). A passivation layer 308, such as a layer of oxide, may be deposited (e.g. by CVD) on the graphene 304 to prevent detrimental reactions with the environment (although this is not absolutely necessary).

FIG. 3c shows a process for making a graphene-based MIM diode in which graphene forms both the top and bottom electrodes. A layer of graphene 304 is first deposited (e.g. transferred mechanically from another substrate) onto an insulating substrate 305 (e.g. glass or an oxidized silicon wafer), before an insulator 306 (e.g. $Al_2O_3$, $HfO_2$, BN or diamond-like carbon) is deposited on top of the graphene 304 (e.g. by ALD or by transferred mechanically from another substrate). Another layer of graphene 312 is then deposited (e.g. transferred mechanically from another substrate) onto a sacrificial substrate 310. To form the MIM diode, the graphene/substrate structure 313 is then transferred face-down onto the insulator 306 and the sacrificial substrate 310 is removed (e.g. by etching). Again, a passivation layer 308, such as a layer of oxide, may be deposited (e.g. by CVD) on the graphene 312 to prevent detrimental reactions with the environment (although this is not absolutely necessary).

It should be noted that one or more of the materials used to form the graphene-based MIM diode may be deposited either as a continuous or patterned (e.g. formed using photo or electron beam lithography in combination with lift-off or etching) film. When continuous films are deposited, the MIM diode will typically cover the entire upper surface of the insulating substrate 305. When patterned films are deposited, however, the MIM diode may cover only part of the upper surface of the insulating substrate 305.

Furthermore, since the insulator 306 is deposited onto the graphene electrode 304 in each of the processes described above, the roughness of the insulator 306 (and therefore the device performance) is unaffected by the roughness of the other electrode 307, 309, 312. As a result, the other electrode 307, 309, 312 may comprise one or more nanopillars (since the insulator thickness will be constant at each nanopillar). This configuration may, however, reduce the effective surface area of the device, because electron tunnelling will only occur at the nanopillar regions.

Figure 4:
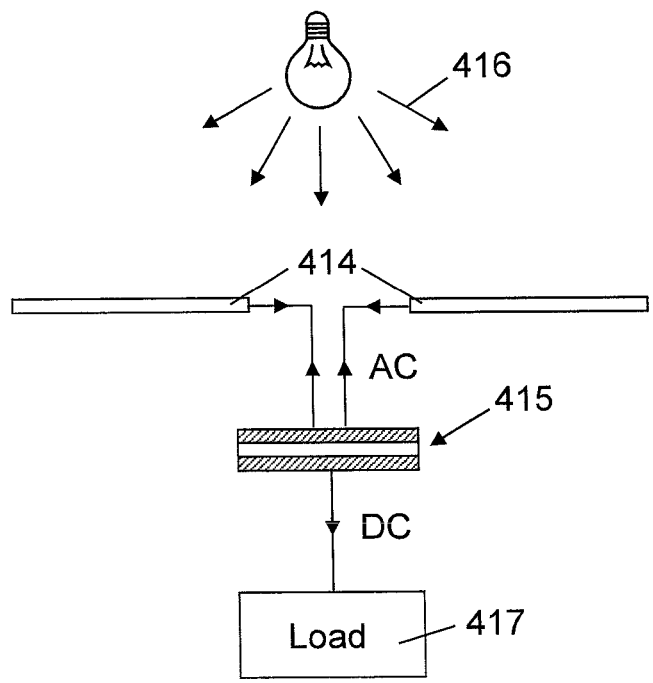
FIG. 4 shows a rectenna comprising the present apparatus.

The graphene-based MIM diodes described herein may be used in rectennas or photodetectors. A rectenna (short for rectifying antenna) comprises an antenna 414 and a diode 415 connected as shown in FIG. 4. When electromagnetic radiation 416 (e.g. UV, IR, visible light, microwave, radio, or X-rays) is incident on the antenna 414, the oscillating electric field induces an alternating current (AC) in the antenna 414 with the electrons moving back and forth at the same frequency as the electromagnetic radiation 416. The diode 415 of the rectenna then converts the alternating current into a direct current (DC) which can be used to power an external load 417.

The resonant frequency of antennas 414 (i.e. the frequency which results in the lowest impedance and thus highest efficiency) scales linearly with the physical dimensions of the antenna 414. In order for rectennas to be used with visible light (having a wavelength of ~380-740 nm and a frequency of ~405-790 THz), the antenna 414 must be on the order of 100 nm in length (i.e. an antenna). One complication with scaling down, however, is that the diodes 415 used in large scale rectennas cannot operate at THz frequencies without a large loss in power. The large loss in power is the result of parasitic capacitance found in p-n and Schottky junction diodes, which is caused by the redistribution of charge in the depletion region every time the bias is reversed. In contrast, MIM diodes are not affected by parasitic capacitance because there is no redistribution of charge within the insulating barrier upon changes in bias. In addition, electrons can tunnel through the insulator far quicker than electrons and holes can travel through a semiconductor. Graphene-based MIM diodes (made for example using one of the methods shown in FIG. 3a-3c) may therefore be used in nantennas configured to convert visible light into direct current.

A photodetector, on the other hand, is a device used to convert photons of electromagnetic radiation (e.g. UV, IR, visible light, microwave, radio, or X-rays) into electricity (either current or voltage depending on the mode of operation). Existing photodetectors comprise a p-n or Schottky junction. When a photon of sufficient energy strikes the detector, it excites an electron thereby creating a free (hot) electron and a positively charged electron hole. If the photon is absorbed in the junction's depletion region (or one diffusion length away from the depletion region), the electrons and holes are swept from the junction by the intrinsic electric field of the depletion region (the holes move toward the anode and the electrons move toward the cathode) resulting in a photocurrent.

MIM diodes provide a number of advantages over the p-n and Schottky diodes used in photodetectors. First of all, the insulating barrier helps to reduce the flow of dark current. Dark current is the relatively small electrical current which flows through the device in the absence of photons. It is produced when electrons and holes are randomly generated by crystallographic defects and thermal energy, and is one of the main sources of noise in a photodetector signal. Since the insulator provides an energy barrier to the electrons which must be overcome before a current can flow, only electrons with energies greater than the tunnelling threshold are able to generate a current. This means that a current will typically only flow when a potential difference is applied across the device or the device is illuminated by electromagnetic radiation, because electrons generated by crystallographic defects and thermal energy will usually have energies below the tunnelling threshold.

Secondly, because electrons can tunnel through the insulator far quicker than electrons and holes can travel through a semiconductor, MIM-based photodetectors have faster response times than p-n and Schottky-based photodetectors (i.e. the time taken for a photocurrent to be produced is smaller).

When a MIM diode is used for photodetection, however, a photocurrent will only be generated if (i) the hot electrons have enough energy to tunnel through the insulating barrier, and (ii) the hot electrons are generated near the barrier. Criterion (ii) is due to the mean free path of electrons. The mean free path of hot electrons in metals is on the order of 10 nm, meaning that only electrons generated within 10 nm of the tunnelling barrier are able to cross the barrier to the other electrode. This criterion places an upper limit on the thickness of the metal layers in existing MIM photodetectors. Using metal layers thicker than 10 nm hinders absorption of photons near the barrier. A 10 nm limit is undesirable, however, because thin layers of metal tend to exhibit greater surface roughness than thicker layers, and as discussed previously, increased surface roughness adversely affects the tunnelling behaviour of MIM diodes.

The graphene-based MIM diodes described herein may provide a number of additional advantages over and above those provided by existing MIM diodes. For example, graphene exhibits greater electron mobility than the electrode materials currently being used in p-n, Schottky and MIM diodes. This feature helps to prevent the electrons from recombining with the holes created by the incident radiation before crossing the junction, thereby increasing the efficiency of the device.

In addition, graphene is optically transparent. This feature allows thicker layers of graphene to be used in forming the electrodes of the diode (without preventing use in electronic displays), which increases the probability of photoemission. Furthermore, since the mean free path of electrons in graphene is ~65 μm, electrons may be generated up to 65 μm from the insulating barrier and still be able to cross the barrier to the other electrode. As mentioned above, increasing the thickness of the electrodes can help to reduce the roughness of the insulating layer, which results in better tunnelling behaviour and a more reliable device.

Also, the spectral bandwidth of a photodetector is typically limited by the electrode material's absorption. For example, photodetectors based on group IV and III-V semiconductors suffer from the "long-wavelength limit" and become optically transparent when the incident energy is smaller than the bandgap. In contrast, since graphene does not have a bandgap, it can therefore absorb photons of any wavelength. This feature allows graphene-based MIM diodes to be used for detecting all types of electromagnetic radiation.

Photodetectors may be operated with (photoconductive mode) or without (photovoltaic mode) an applied potential. The applied potential provides some advantages over photovoltaic mode. For example, the applied potential allows current flow in one direction whilst blocking current flow in the opposite direction. This makes the device unidirectional.

Furthermore, unlike p-n and Shottky junction diodes, MIM diodes do not have an intrinsic electric field. In the absence of an applied voltage, therefore, only hot electrons with a momentum pointing towards the barrier of a MIM diode will stand a chance of tunnelling. This is why "hot-electron MIM photovoltaics" are considered highly inefficient and unsuitable for energy harvesting compared to other technologies and solutions. On the other hand, if a potential difference is applied across a MIM diode, the resulting electric field drives the electrons from one side of the barrier to the other. This makes the photoconductive mode significantly more efficient than the photovoltaic mode.

If the MIM diode is biased below the tunnelling threshold, tunnelling will only occur when the photons provide the additional energy required to overcome the threshold. The amount of energy provided by the photons depends on the photon wavelength, so different biases are required for different wavelengths. Regardless of the wavelength of the photons, however, the application of a voltage reduces the tunnelling threshold for electrons. In this way, even lower energy photons are able to generate a tunnelling current provided a sufficient voltage is applied. The photoconductive mode therefore increases the wavelengths of electromagnetic radiation which can be detected.

For a graphene-based MIM diode to operate as a photodetector, it is advantageous for one graphene layer to be able to absorb electromagnetic radiation impinging on the device. This criterion may be satisfied if: the configuration of FIG. 3b or 3c is used, and the electromagnetic radiation is incident upon the device from above; the configuration of FIG. 3a is used, the electromagnetic radiation is incident upon the device from above, and the upper electrode and insulator are transparent to the radiation; or the configuration of FIG. 3a or 3c is used, the electromagnetic radiation is incident upon the device from below; and the substrate is transparent to the radiation.

Figure 5:
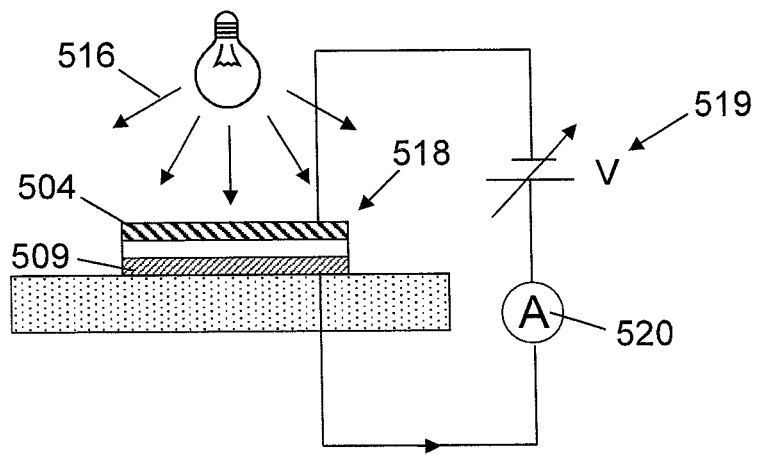
FIG. 5 shows a photodetector comprising the present apparatus.

FIG. 5 shows the graphene-based MIM diode 518 of FIG. 3b (without the passivation layer) configured for used in a photodetector. A bias is applied to the diode 518 using a variable voltage source 519 (such that a negative potential is applied to the graphene electrode 504 and/or a positive potential is applied to the other electrode 509), and the current in the circuit is measured by an ammeter 520. The graphene layer 504 is then exposed to electromagnetic radiation 516 comprising a plurality of wavelengths (white light in this example). The use of a variable voltage source 519 allows the bias to be set for a particular wavelength of light. In this way, only photons of this wavelength and below are able to induce a tunnelling current (as these have sufficient energy to overcome the barrier threshold).

Figure 6A:
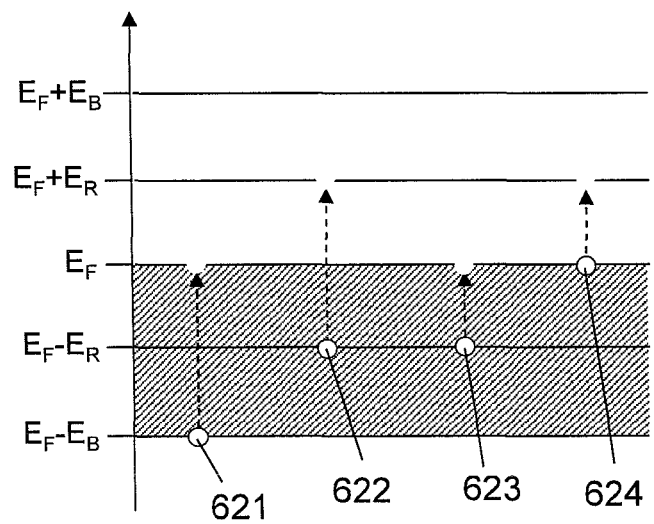
FIG. 6a shows photon-induced electron transitions within a metal.
Figure 6B:
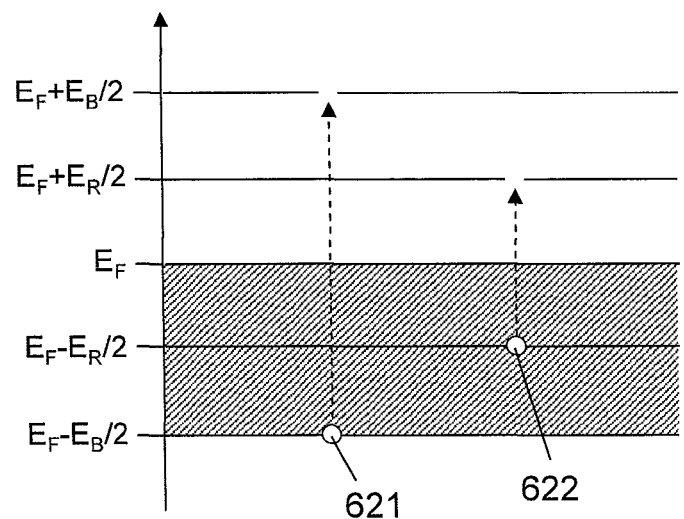
FIG. 6b shows photon-induced electron transitions within graphene.

FIG. 6a shows photon-induced electron transitions within a metal electrode, and FIG. 6b shows photon-induced electron transitions within a graphene electrode. For metals, electrons with energies in the range $E_F-E_{ph} \leq E \leq E_F$ may be excited by the incident light with equal probability, where $E_F$ is the Fermi level of the metal and $E_{ph}$ is the photon energy. This means that, even for monochromatic light, there is a wide distribution of hot electron energies and therefore a wide distribution of tunnelling probabilities.

Furthermore, when the incident light is not monochromatic, photons of different wavelength are able to generate hot electrons of equal energy. As shown in FIG. 6a for example, blue light may increase the energy of electron 1 (621) from $E_F-E_B$ to $E_F$ (where $E_B$ is the energy of blue photons), and may also increase the energy of electron 2 (622) from $E_F-E_R$ to $E_F+E_R$ (where $E_R$ is the energy of red photons). In addition, red light may increase the energy of electron 3 (623) from $E_F-E_R$ to $E_F$, and may also increase the energy of electron 4 (624) from $E_F$ to $E_F+E_R$. In this example, therefore, hot electrons 1 (621) and 3 (623) have the same energy and are indistinguishable. Likewise, hot electrons 2 (622) and 4 (624) have the same energy and are also indistinguishable. As a result, it is impossible to determine whether a detected photocurrent was generated by red light or blue light.

Spectral analysis is possible, however, when the MIM diode comprises a graphene electrode. As a result of graphene's unique band structure, the absorption of photons is possible only through well-define transitions that conserve momentum. As it turns out, only electrons having energies $E_F-Ep_h/2$ are able to generate hot electrons. As shown in FIG. 6b for example, blue light may increase the energy of electron 1 (621) from $E_F-E_B/2$ to $E_F+E_B/2$. Likewise, red light may increase the energy of electron 2 (622) from $E_F-E_R/2$ to $E_F+E_R/2$. Since the energy of hot electrons 1 (621) and 2 (622) are different, and since no other electron transitions are possible with these wavelengths of light, it is possible to deduce the wavelength of light used to generate a detected photocurrent.

Figure 7:
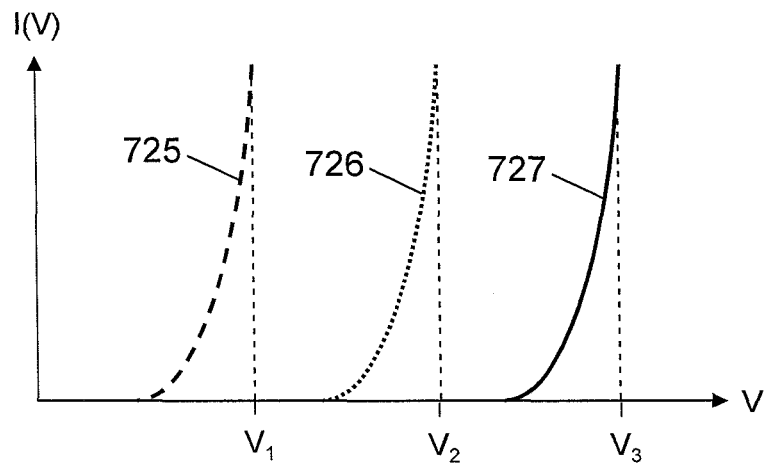
FIG. 7 shows how the tunnelling current varies with applied voltage for the present apparatus.

Spectral information can be extracted by sweeping the bias V and plotting the corresponding I(V) curve under constant illumination. FIG. 7 shows an idealized I(V) plot for a graphene-based photodetector. When the voltage is set to $V_1$ (where $V_1<V_2<V_3$), only blue photons have enough energy to overcome the barrier threshold. A first peak 725 associated with blue light can therefore be seen at $V_1$. When the voltage is increased to $V_2$, blue and red photons have enough energy to overcome the barrier threshold. A second peak 726 associated with red light can therefore be seen at $V_2$. When the voltage is increased further to $V_3$, the potential is so high that the incident photons are not even required to generate a photocurrent (i.e. the potential alone is enough to overcome the tunnelling threshold). A third peak 727 associated with the applied potential can therefore be seen at $V_3$.

Furthermore, the size of a peak is proportional to the intensity of the incident radiation. It is therefore possible to determine the relative intensity of each wavelength based on the detected current. For example, if a current of 100 mA is generated at $V_1$ (produced by blue photons) and a current of 150 mA is generated at $V_2$ (produced by blue and red photons), it can be deduced that the incident radiation comprises half the number of red photons as blue photons (since the current increased by 50% when the voltage was increased from $V_1$ to $V_2$). It should be noted, however, that this example is simplified and does not take account of the other wavelengths present in white light.

Figure 8:
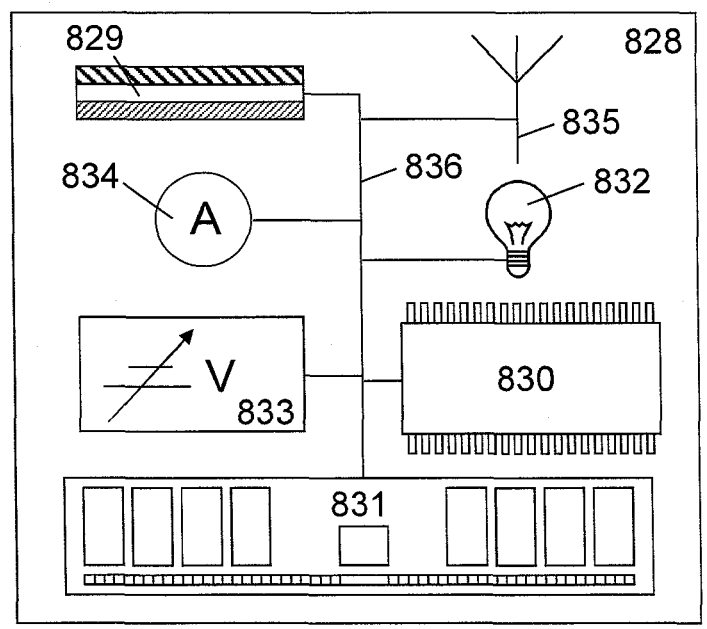
FIG. 8 shows a device comprising the present apparatus as well as one form of the present apparatus when the present apparatus is considered to be a particular device.

FIG. 8 illustrates schematically a device 828 comprising the apparatus (graphene-based MIM diode) 829 described herein (as well as one form of the present apparatus when the present apparatus is considered to be a particular device 828). The device 828 also comprises a processor 830, a storage medium 831, an illumination source 832, a variable voltage source 833, an ammeter 834, and an antenna 835, which are electrically connected to one another by a data bus 836. The device/apparatus 828 may be an electronic device, a portable electronic device, a portable telecommunications device, or a module for any of the aforementioned devices.

The graphene-based MIM diode 829 is configured to allow a flow of electrons from one electrode, across an insulating barrier to another electrode. The graphene-based MIM diode 829 may also be configured to prevent a flow of electrons in the opposite direction.

The processor 830 is configured for general operation of the device 828 by providing signalling to, and receiving signalling from, the other device components to manage their operation.

The storage medium 831 is configured to store computer code configured to perform, control or enable operation of the graphene-based MIM diode 829. The storage medium 831 may also be configured to store settings for the other device components. The processor 830 may access the storage medium 831 to retrieve the component settings in order to manage the operation of the other device components. In particular, the storage medium 831 may be configured to store the bias voltages associated with each wavelength of incident radiation. The storage medium 831 may be a temporary storage medium such as a volatile random access memory. On the other hand, the storage medium 831 may be a permanent storage medium such as a hard disk drive, a flash memory, or a non-volatile random access memory.

The illumination source 832 is configured to produce electromagnetic radiation which may be used to illuminate the graphene-based MIM diode 829 and generate hot electrons. The illumination source 832 may be configured to generate one or more of UV, IR, visible light, microwave, radio, and X-rays.

The variable voltage source 833 is configured to apply a potential difference across the electrodes in order to bias the graphene-based MIM diode 829, and the ammeter 834 is configured to measure any current produced when electrons (e.g. hot electrons) tunnel through the insulating barrier of the graphene-based MIM diode 829.

The antenna 835 is configured to convert electromagnetic radiation to an alternating current. The graphene-based MIM diode 829 may be configured to convert the alternating current to a direct current.

Figure 9:
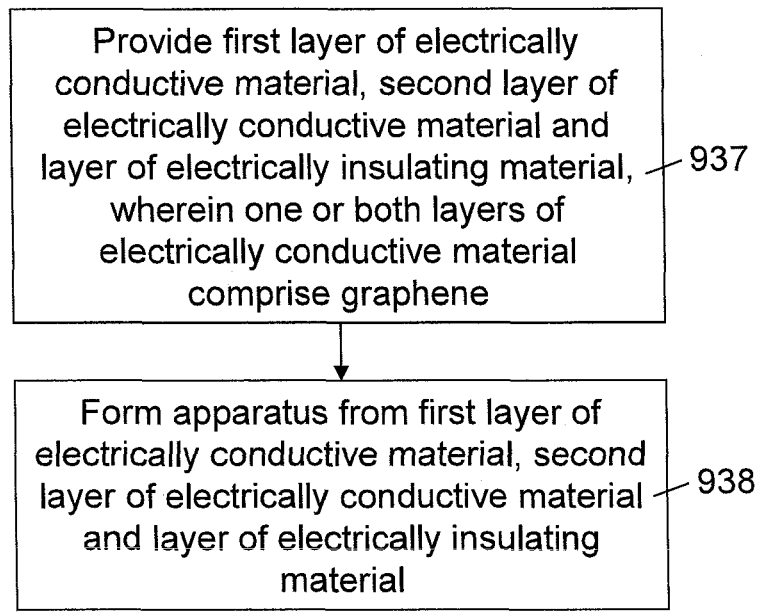
FIG. 9 shows a method of making the present apparatus.
Figure 10:
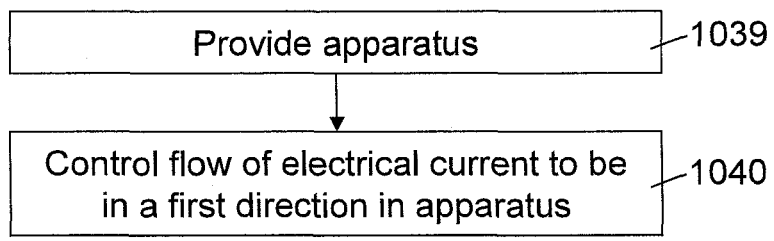
FIG. 10 shows a method of using the present apparatus.

The main steps 937-938 of the method used to make the graphene-based MIM diode 829 are illustrated schematically in FIG. 9. Similarly, the main steps 1039-1040 of the method used to operate the graphene-based MIM diode 829 are illustrated schematically in FIG. 10.

It will be appreciated that in embodiments where the apparatus is a tunnel photodetector, graphene will be used to act as the transmitting electrode (because the useful light is absorbed by graphene). When the apparatus is a general MIM diode, the apparatus can be configured such that the electrons tunnel through the insulator from the graphene electrode to the other electrode or the apparatus could be configured such that the electrons tunnel through the insulator from the other electrode to the graphene.

As has been mentioned, the apparatus may be configured such that electrons are unable to tunnel from the second layer of electrically conductive material through the layer of electrically insulating material to the first layer of electrically conductive material by virtue of providing a difference in voltage to the first and second layers of electrically conductive material, and/or providing a difference in work function between the first and second layers of electrically conductive material. It will be appreciated that, in a graphene/insulator/metal structure, the difference in work function between graphene and the metal will give rise to an asymmetry in the tunneling and thus diode-like behaviour. On the other hand, a graphene/insulator/graphene structure will be symmetric (unless one graphene layer is treated as such to offset its work function) and tunneling of electrons will be perfectly bidirectional upon reversing the bias.

Figure 11:
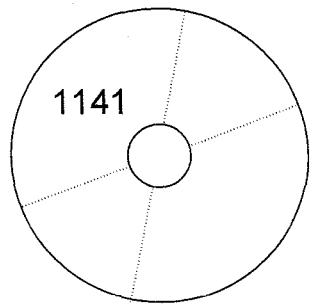
FIG. 11 shows a computer readable medium comprising a computer program for controlling the making and/or use of the present apparatus.

FIG. 11 illustrates schematically a computer/processor readable medium 1141 providing a computer program according to one embodiment. In this example, the computer/processor readable medium 1141 is a disc such as a digital versatile disc (DVD) or a compact disc (CD). In other embodiments, the computer/processor readable medium 1141 may be any medium that has been programmed in such a way as to carry out an inventive function. The computer/processor readable medium 1141 may be a removable memory device such as a memory stick or memory card (SD, mini SD or micro SD).

The computer program may comprise computer code configured to perform, control or enable the following: forming an apparatus from a first layer of electrically conductive material, a second layer of electrically conductive material and a layer of electrically insulating material to provide an apparatus comprising the first and second layers of electrically conductive material separated by the layer of electrically insulating material, wherein one or both layers of electrically conductive material comprise graphene, and wherein the apparatus is configured such that electrons are able to tunnel from the first layer of electrically conductive material through the layer of electrically insulating material to the second layer of electrically conductive material.

Additionally or alternatively, the computer program may comprise computer code configured to perform, control or enable one or more of the following: depositing the first layer of electrically conductive material on top of a supporting substrate; depositing the layer of electrically insulating material on top of the first layer of electrically conductive material; and depositing the second layer of electrically conductive material on top of the layer of electrically insulating material.

Additionally or alternatively, the computer program may comprise computer code configured to perform, control or enable one or more of the following: depositing the first layer of electrically conductive material on top of a first supporting substrate; depositing the layer of electrically insulating material on top of the first layer of electrically conductive material; depositing the second layer of electrically conductive material on top of a second supporting substrate; placing the first supporting substrate on top of the second supporting substrate such that the first layer of electrically conductive material is separated from the second layer of electrically conductive material by the layer of electrically insulating material; and removing the first supporting substrate.

Additionally or alternatively, the computer program may comprise computer code configured to perform, control or enable one or more of the following: depositing the first layer of electrically conductive material on top of a first supporting substrate; depositing the layer of electrically insulating material on top of the first layer of electrically conductive material; depositing the second layer of electrically conductive material on top of a second supporting substrate; placing the second supporting substrate on top of the first supporting substrate such that the first layer of electrically conductive material is separated from the second layer of electrically conductive material by the layer of electrically insulating material; and removing the second supporting substrate.

Additionally or alternatively, the computer program may comprise computer code configured to perform the following: controlling a flow of electrical current to be in a first direction in an apparatus, the apparatus comprising first and second layers of electrically conductive material separated by a layer of electrically insulating material, wherein one or both layers of electrically conductive material comprise graphene, and wherein the apparatus is configured such that electrons are able to tunnel from the first layer of electrically conductive material through the layer of electrically insulating material to the second layer of electrically conductive material, the flow of electrical current controlled by providing a difference in voltage to the first and second layers of electrically conductive material, and/or providing a difference in work function between the first and second layers of electrically conductive material.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising first and second layers of electrically conductive material separated by a layer of electrically insulating material comprising one or more of $Al_2O_3$, $HfO_2$, BN and diamond-like carbon, wherein one or both layers of electrically conductive material comprise graphene configured to be exposed to electromagnetic radiation, and wherein the apparatus is configured such that electrons are able to tunnel from the first layer of electrically conductive material through the layer of electrically insulating material to the second layer of electrically conductive material via a quantum mechanical tunneling mechanism, wherein the apparatus is a diode and forms part of a photodetector, and wherein the layer of electrically insulating material is about 5 nm to about 15 nm.

2. The apparatus of claim 1, wherein one or both of the first and second layers of electrically conductive material are made solely from graphene.

3. The apparatus of claim 1, wherein the first layer of electrically conductive material comprises graphene, and the second layer of electrically conductive material comprises one or more of Cr, Au, Al, Ni, Cu, Pt, W, and indium tin oxide or an alloy comprising one or more of the same.

4. The apparatus of claim 1, wherein one or more of the first layer of electrically conductive material, the second layer of electrically conductive material and the layer of electrically insulating material are optically transparent.

5. The apparatus of claim 1, wherein the apparatus is formed on a supporting substrate, and wherein the supporting substrate is electrically insulating and/or optically transparent.

6. The apparatus of claim 1, wherein the second layer of electrically conductive material comprises one or more nanopillars.

7. The apparatus of claim 1, wherein the apparatus comprises a passivation layer on top of the first or second layer of electrically conductive material.

8. The apparatus of claim 1, wherein the electrons are hot electrons generated when the first layer of electrically conductive material is illuminated by electromagnetic radiation.

* * * * *